United States Patent
Tsushima et al.

(10) Patent No.: US 7,145,791 B2
(45) Date of Patent: Dec. 5, 2006

(54) MEMORY DEVICE HAVING VARIABLE RESISTIVE MEMORY ELEMENT

(75) Inventors: Tomohito Tsushima, Kanagawa (JP); Katsuhisa Aratani, Chiba (JP); Akira Kouchiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 26 days.

(21) Appl. No.: 11/042,959

(22) Filed: Jan. 25, 2005

(65) Prior Publication Data

US 2005/0174854 A1 Aug. 11, 2005

(30) Foreign Application Priority Data

Jan. 29, 2004 (JP) ............................ P2004-022121

(51) Int. Cl.
*G11C 11/00* (2006.01)
(52) U.S. Cl. ....................................... 365/148; 365/163
(58) Field of Classification Search ................ 365/148, 365/163
See application file for complete search history.

(56) References Cited

U.S. PATENT DOCUMENTS 6,954,385 B1 * 10/2005 Casper et al. .......... 365/189.07

2004/0184331 A1 * 9/2004 Hanzawa et al. ........... 365/203
2005/0174840 A1 8/2005 Tsushima et al.

\* cited by examiner

*Primary Examiner*—Tuan T. Nguyen
(74) *Attorney, Agent, or Firm*—Wolf, Greenfield, & Sacks, P.C.

(57) ABSTRACT

A memory device is obtained in which stable recording of information can be performed and a period of time required for the recording of information can be shortened. The memory device includes a memory cell C formed of a memory element Amn having a characteristic in which a resistance value changes when applying between both ends of the memory element Amn a voltage equal to or more than a threshold voltage and a circuit element Tmn as a load connected in series to the memory element Amn; and when an operation to change the memory element Amn from a state of high resistance value to a state of low resistance value is defined as writing and when a voltage applied between both ends of the memory element Amn and the circuit element Tmn is equal to or more than a certain voltage value which is larger than the threshold voltage, the memory device has a characteristic in which a combined resistance value of the memory element Amn and the circuit element Tmn in the memory cell C after writing becomes almost constant value irrespective of the magnitude of applied voltage.

3 Claims, 7 Drawing Sheets

MEMORY DEVICE HAVING VARIABLE RESISTIVE MEMORY ELEMENT

BACKGROUND OF THE INVENTION

1. Field of the Invention

The present invention relates to a memory device in which a memory cell is formed using a memory element which stores information according to a state of electric resistance.

2. Description of the Related Art

In information equipment such as a computer, a high-density DRAM that performs a high-speed operation is widely used as a random access memory.

However, since the DRAM is a volatile memory in which information disappears when a power supply is shut off, there has been a demand for a nonvolatile memory in which information does not disappear.

Further, as the nonvolatile memory which is assumed to be promising in the future, there have been proposed an FeRAM (ferroelectric memory), an MRAM (magnetic memory), a phase change memory and a resistance change type memory such as a PMC (Programmable Metallization Cell) or an RRAM.

In case of those memories, it becomes possible to retain written information for a long period of time even if there is no power supply.

Further, in case of those memories, a refreshing operation is unnecessary by making them nonvolatile, so that power consumption can be reduced to that extent.

However, in the case of FeRAM, currently it is difficult to perform a nondestructive readout, and since a destructive readout is performed, a reading speed is slow. Moreover, since a restriction exists with respect to the number of times in polarization reversal by the readout or the recording, there is a limitation in the rewritable number of times.

In the case of MRAM, since recording requires a magnetic field, the magnetic field is generated by electric current flowing in wiring. For this reason, a large amount of electric current is required when the recording is performed.

A phase change memory is a memory which performs the recording by applying a voltage pulse having the same polarity and different magnitude.

Since the phase change memory generates switching in accordance with a temperature, there remains a problem of being sensitive to a change of environmental temperature.

In the resistance change type nonvolatile memory such as PMC or RRAM, a material having a characteristic that a resistance value changes by applying a voltage or current is used for a memory layer in which information is stored.

Therefore, since a relatively simple structure is employed in which two electrodes are provided with the memory layer in between and a voltage or current is applied to those two electrodes, a memory element can easily be miniaturized.

PMC has a structure in which an ionic conductor containing a certain metal is interposed between two electrodes, and one of those two electrodes is made to contain the metal which is contained in the ionic conductor, thereby using a characteristic in which an electrical property such as a resistance or capacitance of the ionic conductor changes when the voltage is applied between the two electrodes (for example, refer to patent reference 1).

Specifically, an ionic conductor is composed of a solid solution made of chalcogenide and a metal (for example, amorphous GeS or amorphous GeSe), and one of the two electrodes contains Ag, Cu or Zn (refer to the patent reference 1).

In addition, since a crystallization temperature of amorphous GeS or amorphous GeSe is approximately 200 degrees Celsius in the PMC and the characteristic becomes deteriorated when the ionic conductor is crystallized, there is a problem that PMC can not endure a high temperature in a process of actually producing the memory element, which is a process of forming a CVD insulation film or a protection film or the like, for example.

As a structure of RRAM, there has been introduced the one in which polycrystal $PrCaMnO_3$ thin film, for example, is interposed between two electrodes and a resistance value of $PrCaMnO_3$ which is the recording film is greatly changed by applying a voltage pulse or a current pulse to the two electrodes (refer to non-patent reference 1).

Further, a voltage pulse having a different polarity is applied at the time of recording (writing) information and at the time of erasing information.

Moreover, as another structure of the RRAM, there has been introduced the structure in which $SrZrO_3$ having Cr slightly doped (of either a monocrystal or polycrystal), for example, is interposed between two electrodes and a resistance value of the recording film is changed by the current flowing from those electrodes (refer to non-patent reference 2).

I-V characteristic of memory layer is shown in the non-patent reference 2, and a threshold voltage when recording and erasing is set to ±0.5 volt. Even in this structure, recording and erasure of information can be performed by applying a voltage pulse, and the required pulse voltage is assumed to be ±1.1 volts and the width thereof is 2 ms.

Further, high speed recording and erasing can be performed, and an operation at the voltage pulse width of 100 ns is reported. In this case, the required pulse voltage is ±5 volts.

However, since each material of the memory layer which is proposed in the structure of above mentioned RRAM is a crystalline material, there occur such problems as: heat treatment of approximately 600 degrees Celsius is required, it is very difficult to manufacture the monocrystal of proposed materials, the miniaturization becomes difficult due to the reason that there is an influence of grain boundary when the polycrystal is used, and so forth.

[Patent reference 1] Japanese Translation of PCT International Application No. 2002-536840

[Non-patent reference 1] "Novel Colossal Magneto resistive Thin Film Nonvolatile Resistance Random Access memory (RRAM)" written by W. W. Zhuang et al. in Technical Digest "International Electron Device Meeting" of 2002, page. 193

[Non-patent reference 2] "Reproducible switching effect in thin oxide films for memory applications" written by A. Beck et al. in Applied Physics Letters of 2000, vol. 77, pages. 139–141

Further, in the above mentioned RRAM, it is proposed to perform the recording or erasure of information by applying a pulse voltage; however, in the proposed structure, the resistance value of the memory layer after recording changes depending on the pulse width of the applied pulse voltage.

Moreover, the fact that the resistance value after recording is thus dependent on the pulse width of the recording indicates indirectly that the resistance value will also change when the same pulse is repeatedly applied.

For example, in the above mentioned non-patent reference 1 it is reported that the resistance value after recording changes greatly depending on the pulse width when the pulse having the same polarity is applied. That shows a characteristic in which in the case where the pulse width is 50 ns or shorter, a rate of resistance change due to the recording becomes small; and in the case where the pulse width is 100 ns or longer, the resistance value does not saturate to a constant value but conversely, the longer the pulse width becomes, the closer it comes to the resistance value before recording.

Moreover, a characteristic of memory structure having the memory layer and a MOS transistor for access control connected in series to be disposed in an array-form is introduced in the non-patent reference 1, and it is reported that the resistance value of the memory layer after recording changes depending on the pulse width when the pulse width is changed in the range from 10 ns to 100 ns. When the pulse width is made further longer, it is presumed from the characteristic of the memory layer that the resistance decreases again.

In other words, since the resistance value after recording is dependent on the magnitude and the pulse width of pulse voltage in the case of RRAM, there occurs a dispersion in the resistance value after recording when there is a dispersion in the magnitude and the pulse width of a pulse voltage.

Accordingly, when the pulse voltage is shorter than approximately 100 ns, the rate of resistance change due to the recording is small and it becomes susceptible to the dispersion in the resistance value after recording, and therefore it is difficult to perform the recording stably.

Then, when the recording is performed with such short pulse voltage, a process of confirming (verifying) contents of information needs to be performed after recording in order to perform the recording without fail.

For example, a process of reading and confirming the contents of information (the resistance value of the memory layer) which have been already recorded in the memory element is carried out before performing the recording, and the recording is to be performed correspondingly to a relation between the confirmed contents (resistance value) and the contents to be recorded from now on (resistance value).

As an alternative, a process of reading and confirming the contents of information which are recorded in the memory element is carried out after performing the recording, for example, and when there exists a difference from a desired resistance value, re-recording is performed to obtain a desired resistance value corrected.

Accordingly, the period of time required for recording becomes long, and it becomes difficult to perform overwriting of data or the like at a high speed, for example.

In order to solve the above mentioned problems, the present invention is to provide a memory device in which recording can be performed stably and the time required for recording information can be shortened.

SUMMARY OF THE INVENTION

A memory device according to the present invention includes: a memory element having a characteristic in which a resistance value is changed by applying a voltage equal to or larger than the threshold voltage between both ends thereof and a circuit element as a load connected in series to the memory element to form a memory cell, in which when an operation to change the memory element from a state of high resistance value to a state of low resistance value is defined as writing, and when a voltage applied between both ends of the memory element and the circuit element is more than a certain voltage value which is larger than the threshold voltage, a characteristic in which a combined resistance value of the memory element and the circuit element in the memory cell after writing becomes almost a constant value irrespective of the magnitude of voltage.

According to the above mentioned memory device of the present invention, when the voltage applied between the both ends of the memory element and the circuit element is equal to or more than a certain voltage value which is larger than the threshold voltage, the characteristic is obtained in which the combined resistance value of the memory element and the circuit element in the memory cell after writing becomes almost a constant value irrespective of the magnitude of voltage, so that regardless of the resistance value of the memory element before writing being high or low, the combined resistance value of the memory cell after writing becomes almost the same in both the cases.

In other words, even when writing is further performed on the memory cell in which the writing has already been performed and the resistance value of the memory element has become low, there is no such case that the combined resistance value of the memory cell falls excessively.

Accordingly, the writing can be performed without fail not depending on the resistance value of the memory element before writing.

Moreover, when the information which has been recorded on the memory cell is read, the recorded information can be detected easily from an output signal based on the combined resistance value of the memory cell, and therefore a read-out error can be prevented from occurring.

Further, since the writing can be performed without fail and the read-out error can be prevented from occurring, such process of verification that an erasure is performed prior to the recording (writing or erasing) of information, or the read-out is performed prior to the recording (writing or erasing) of information to feed back a result of the read-out to a voltage control circuit becomes unnecessary.

Moreover, since the process of verification becomes unnecessary and also there is no need to apply repeatedly the voltage pulse, the writing can be performed quickly. Further, since the read-out error can be prevented from occurring, there is no need to perform the reading again. Accordingly, the recording of information or the read-out of information can be performed at a high speed.

According to the above mentioned present invention, the recording of information can be performed stably and the time required for recording of information can be shortened.

Accordingly, a memory device which can operate at a high speed and which has high reliability can be obtained.

BRIEF DESCRIPTION OF THE DRAWINGS

FIGS. 7A through 7C are diagrams showing results of the I-V characteristic of respective memory cells measured when a resistance value of the resistance element of FIG. 6 is 1 kΩ, 2 kΩ and 5 kΩ;

DESCRIPTION OF THE PREFERRED EMBODIMENTS

Hereinafter, an embodiment of a memory device according to the present invention is explained. In the present invention, the memory device includes a memory cell using a resistance change type memory element.

Figure 1:
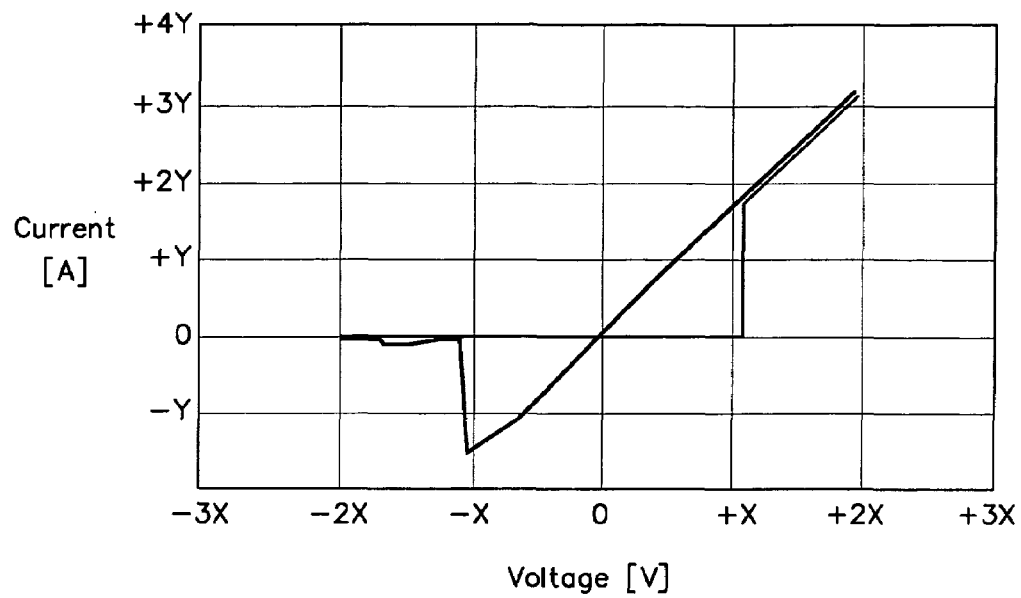
FIG. 1 is a diagram showing the change of voltage and current of a resistance change type memory element used in a memory device in an embodiment of the memory device according to the present invention.

First, FIG. 1 shows the change of voltage and current of the resistance change type memory element used in a memory device in an embodiment of the memory device according to the present invention.

Specifically, in the initial state this resistance change type memory element is in a state where current can not flow easily, because a resistance value is large; however, when a voltage equal to or more than a writing threshold voltage (+1.1X [V] of FIG. 1, which is several hundreds milli-volts, for example) is applied, the current flows and the resistance value is lowered.

Then, the memory element changes into that having Ohmic characteristic, so that a state where the current flows in proportion to the voltage is obtained.

Subsequently, even if the voltage is returned to zero volt, the resistance value thereof (low resistance value) is maintained.

Then, when a negative voltage is applied to the memory element and the applied voltage is gradually increased, the current decreases at an erasure threshold voltage (−1.1X [V] of FIG. 1, which is several hundreds milli-volts, for example) to change into the same high resistance as that of the initial state.

After that, even if the voltage is returned to zero volt, the resistance value thereof (high resistance value) is maintained.

In addition, although the range of voltage applied is set from −2X to +2X in FIG. 1, no change of resistance value is observed in this memory device even if the applied voltage is made larger than that.

Since this resistance change type memory element has the above mentioned voltage-current characteristic, similarly to a conventional resistance change type memory element a nonvolatile memory which records 1-bit information can be obtained. This resistance change type memory element is the one capable of alone constituting a memory cell C of the memory device.

As the resistance change type memory element having the I-V characteristic as shown in FIG. 1, there can be listed one in which in a memory element composed of a memory layer interposed between a first electrode and a second electrode (for example, between a lower electrode and an upper electrode) for example, the memory layer is made of an amorphous thin film such as a rare-earth oxide film, for example.

In case of the memory element of this structure, preferably the film thickness of the memory layer is made to have 10 nm or less, and more preferably to have 5 nm or less.

Further, it is desirable that a metal such as Cu, Ag, or Zn which is easily ionized is contained in the rare-earth oxide film.

In this embodiment, an MIS transistor is particularly used for this resistance change type memory element as an active element for controlling an access to this memory element. Further, as shown in a circuit diagram of FIG. 2, an MIS transistor T is connected in series to a resistance change type memory element A to constitute the memory cell C of the memory device. Accordingly, the MIS transistor T also acts as a load to the resistance change type memory element A.

Figure 2:
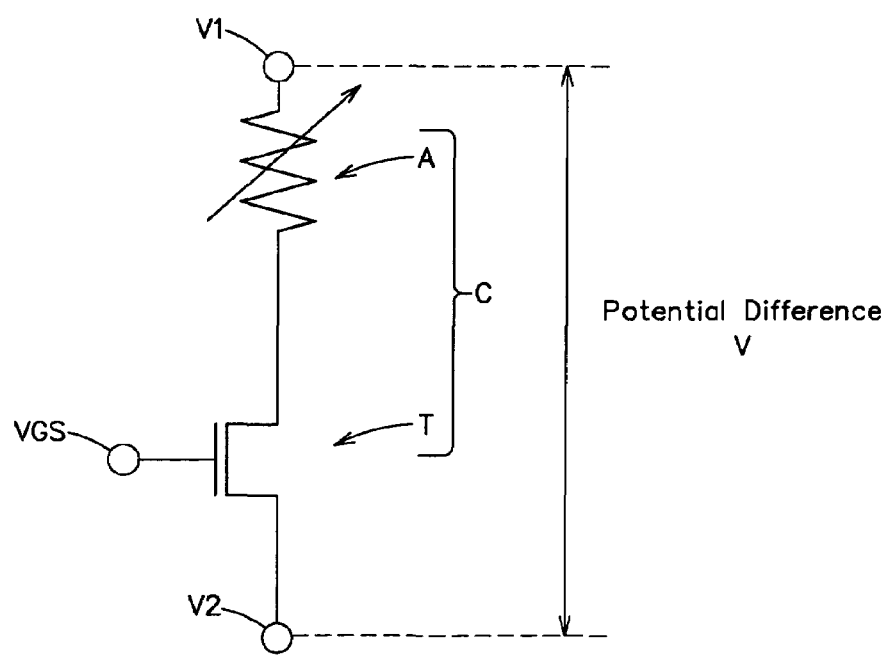
FIG. 2 is a circuit diagram of a memory cell formed of the resistance change type memory element in an embodiment of the memory device according to the present invention.

Specifically, as shown in FIG. 2, a terminal voltage V1 is applied to a terminal of the resistance change type memory element A on the opposite side to a terminal which is connected to the MIS transistor T, a terminal voltage V2 is applied to the other terminal (for example, on a source side) of the MIS transistor T on the opposite side to the terminal connected to the resistance change type memory element A, and a gate voltage $V_{GS}$ is applied to a gate of the MIS transistor T.

Then, the terminal voltages V1 and V2 are respectively applied to both the ends of the resistance change type memory element A and the MIS transistor T which constitute the memory cell C to generate a potential difference V (=|V2−V1|) between the both terminals.

In addition, it is desirable that an on-resistance value of the MIS transistor T is lower than the high resistance value of the resistance change type memory element A. It is more desirable that on-resistance value of the MIS transistor T is less than a fraction of the high resistance value of the resistance change type memory element A, for example, so as to become sufficiently low.

This is due to a reason that when the on-resistance value of the MIS transistor T is high, the potential difference which is applied between the terminals is mostly applied to the MIS transistor T and a loss of electric power occurs, so that the applied voltage can not be used efficiently for the change of resistance in the memory element A.

Further, the memory device of the present embodiment is structured so that the resistance value of the memory cell C after recording information can be almost constant irrespective of a value of the applied voltage (potential difference in FIG. 2) V to the memory cell C.

Accordingly, even if as described later on in detail there is a dispersion in the voltage applied to the memory cell C, stable information recording can be performed and a read-out error can be prevented from occurring when the recorded information is read out.

Figure 3:
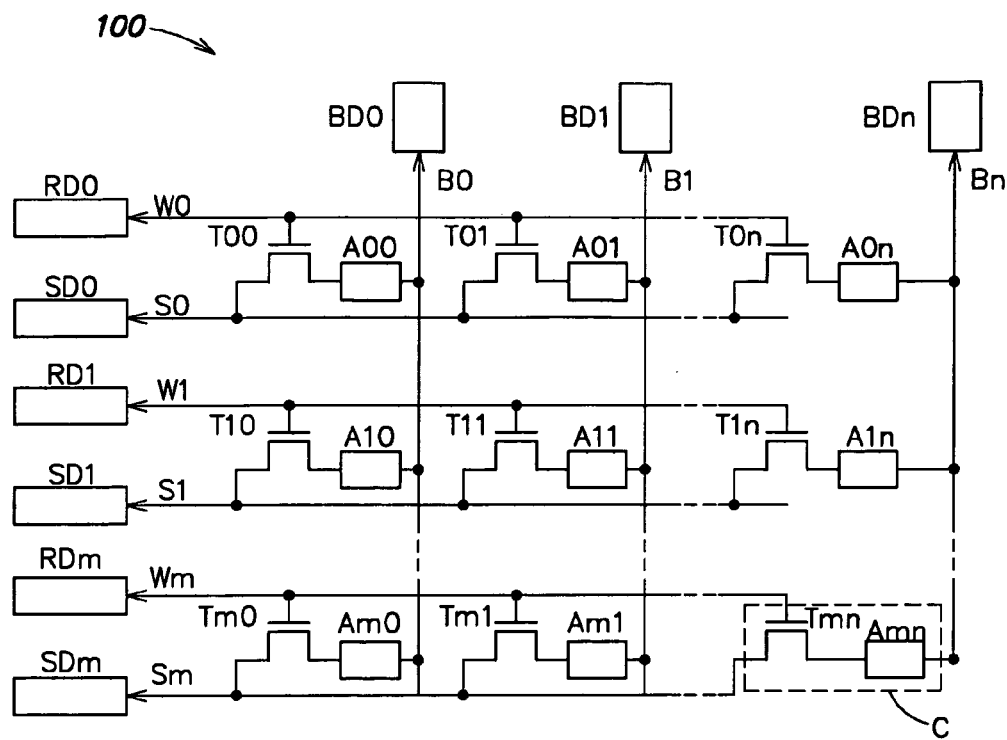
FIG. 3 is an electric circuit diagram of an embodiment of the memory device according to the present invention.

Next, an electric circuit diagram of the memory device according to this embodiment is shown in FIG. 3. This electric circuit diagram includes a voltage control circuit to apply each of the voltages (V1, V2 and VGS) shown in FIG. 2.

A memory device 100 is formed of the memory cells C of (m+1) columns and (n+1) rows disposed in matrix shape. The memory cell C has a structure in which one end of the resistance change type memory element A is connected to one end of the transistor T (here, a drain) as shown in FIG. 2.

The gate of the transistor T (T00 through Tmn) is connected to a word line W (W0 through Wm). The other end of the resistance change type memory element A is connected to a bit line B (B0 through Bn). Further, the other end (source) of the transistor T is connected to a source line S (S0 through Sm).

Furthermore, the bit line B (B0 through Bn) is connected to a bit decoder BD (BD0 through BDn) which is the voltage control circuit thereof. The word line W (W0 through Wm) is connected to a row decoder RD (RD0 through RDm) which is the voltage control circuit thereof. The source line S (S0 through Sm) is connected to a source decoder SD (SD0 through SDm) which is the voltage control circuit thereof.

In the memory device 100 of this embodiment thus structured, information recording can be performed in the following manner, for example.

The gate voltage $V_{GS}$ is applied by the row decoder RD to the word line W corresponding to the memory cell C on which the recording of information should be performed to turn on the gate of the MIS transistor T. Further, the terminal voltages V1 and V2 shown in FIG. 2 are applied by the bit decoder BD and the source decoder SD respectively to the bit line B and the source line S corresponding to the memory cell C. Accordingly, the voltage V can be applied to the resistance change type memory element A and the MIS transistor T in the memory cell C.

When the voltage V is thus applied, if the voltage applied to the both ends of the resistance change type memory element A is larger than the above described writing threshold voltage of the resistance change type memory element A, the resistance value of the resistance change type memory element A falls from the state of high resistance and makes a transition to the state of low resistance.

Accordingly, the recording (hereinafter, referred to as writing) of information (for example, data "1") can be performed on the resistance change type memory element A.

Further, when the resistance value of the resistance change type memory element A is in the state of low resistance, and when the gate of the MIS transistor T is turned on and the voltage V having a reverse polarity to that of writing is applied to the resistance change type memory element A and the MIS transistor T in the memory cell C, if the voltage applied to the both ends of the resistance change type memory element A is larger than the above mentioned erasure threshold voltage of the resistance change type memory element A, the resistance value of the resistance change type memory element A increases from the state of low resistance to make a transition to the state of high resistance.

Accordingly, the recording (hereinafter, referred to as erasing) of information (for example, data "0") can be performed on the resistance change type memory element A.

In addition, since the word line W is shared with the memory cells C of each row, the gates of the MIS transistors T are turned on in all memory cells C of the same row at this time.

Therefore, in case of performing the recording of information on, for example, only part of memory cells C, with respect to other memory cells C on which the recording of information is not performed among memory cells C of the same row, the potential of the bit line B is set to be the same as the potential of the source line S or is set so that a potential difference from the source line S becomes sufficiently smaller than the threshold voltage (writing threshold voltage or erasure threshold voltage) of the resistance change type memory element A, and the recording is not performed thereon.

Next, in the memory cell C of the memory device 100 according to this embodiment, an explanation is schematically made with respect to the change when the voltage is applied to the both ends thereof.

The voltage V applied to the both ends of the memory cell C is divided and applied to the memory element A and the MIS transistor T.

At that time, if the on-resistance value of the MIS transistor T is sufficiently lower than the high resistance value of the memory element A as mentioned above, almost all the applied voltage is applied to the both ends of the memory element A in the state where the resistance value of the memory element A is high. Specifically, with respect to the voltage VA applied between the both ends of the memory element A, VA=V is almost obtained.

Hereupon, when the applied voltage V is larger than a threshold voltage Vth of the memory element A (V>Vth), a recording operation is started and a resistance value R1 of the memory element A starts to fall. The voltage VA between the both ends of the memory element A also decreases along with the fall of the resistance value R1 of the memory element A.

Then, when the voltage VA between the both ends of the memory element A decreases to a certain voltage Vmin ($\geq$Vth), the decrease of the resistance value R1 of the memory element A stops and the resistance value R1 does not decrease any more. Accordingly, the voltage VA between the both ends of the memory element A also stops at the Vmin.

This is due to a reason that: when the voltage VA between the both ends of the memory element A decreases by the fall of the resistance value R1 of the memory element A, a relation between an current I which flows in the memory element A and the voltage VA between the both ends of the memory element A comes closer to the I-V characteristic of the memory element A; and when reached the I-V characteristic of the memory element A, no change is possible. In other words, in order to further decrease the resistance value R1 of the memory element A after reaching the I-V characteristic of the memory element A, this time the voltage VA between the both ends of the memory element A needs to increase; however, if this voltage VA is increased, the current I which flows in the memory element A also increases, and since the same current I also flows in the MIS transistor T connected in series to the memory element A, the voltage (V-VA) applied between the both ends of the MIS transistor T also increases correspondingly to the increase of the current I. However, since the voltage V applied to the memory cell C is constant and the voltages (VA, V-VA) which are respectively applied between the both ends of each of the elements A and T are obtained by dividing the applied voltage V, it is impossible to increase the both simultaneously.

Accordingly, the fall of the resistance value R1 of the memory element A stops in the state of having reached the I-V characteristic of the memory element A, and the voltages (VA, V-VA) which are applied between the both ends of each of the elements A and T become the constant values, respectively.

Hereinafter, this state is referred to as an operating point of this memory cell C. In the memory cell C of the memory device 100 according to this embodiment, the recording operation (writing operation) of information stops at this operating point.

The voltage at the both ends of each of the elements A and T and the current which flows in the memory cell C at this operating point can be obtained from the I-V characteristic of the memory element A and the I-V characteristic of the MIS transistor T.

Next, when performing the recording (erasure) of information by making the polarity of the applied voltage V reversed, due to a reason that the resistance value of the memory element A is low the applied voltage V is set such that the voltage VA applied between the both ends of the memory element A may become larger than the erasure threshold voltage of the memory element A.

When the voltage VA applied between the both ends of the memory element A is larger than the erasure threshold voltage of the memory element A, the recording (erasure) of information starts and the resistance value of the memory element A increases. Since the divided voltage to the memory element A, that is, the voltage VA applied between the both ends of the memory element A also increases along with the increase of the resistance value of the memory element A, the resistance value of the memory element A further increases. When the resistance value of the memory element A becomes large (high resistance) to some extent, the resistance value does not increase any further, so that the recording operation (erasing operation) of information stops at this point.

Similarly to the above mentioned operating point, the voltages at the both ends of each of the elements A and T and the current which flows in the memory cell C in this state can also be obtained from both the I-V characteristic of the memory element A and the I-V characteristic of the MIS transistor T.

By thus applying the voltage V to the both ends of the memory cell C, the recording of information, that is, the writing or the erasure can be performed on the memory element A of that memory cell C.

Hereupon, in a memory element having a characteristic in which the resistance value does not become almost constant but falls along with the increase of the applied voltage V, when the voltage is applied to perform the recording (writing) in the state of low resistance where the recording (writing) has already been performed, the resistance value of the memory element further starts to fall.

As a result, when a memory cell is composed of this memory element alone, the resistance value of the memory cell after performing the recording (writing) differs depending on the resistance value of the memory element before performing the recording. In this case, it may become difficult to read the recorded information or there may occur a read-out error.

Moreover, when the resistance value of the memory element falls excessively, since the voltage required for making the memory element into the state of high resistance becomes extremely large, the power consumption at this time and a load imposed on a circuit of the memory device may increase.

On the other hand, in the memory device 100 of this embodiment, since the resistance value of the memory cell C after recording (after writing) the information becomes almost constant irrespective of the value of voltage V applied to the memory cell C, the recording of information can be performed without fail not depending on the resistance value of the memory element A before performing the recording.

Thus, since the recording of information can be performed without fail, such process (verification process) that the erasure is performed prior to the recording of information or the read-out is performed prior to the recording of information to feed back the result of the read-out to the voltage control circuit is not required, and therefore what is called overwriting becomes possible.

Further, in the memory device 100 of this embodiment, since the resistance value of the memory cell C becomes almost constant after recording the information and the resistance value of the memory element does not fall excessively, the voltage required for making the memory cell C into the state of high resistance can be made small.

According to the above mentioned memory device 100 of this embodiment, the resistance change type memory element A and the MIS transistor T are connected in series to form the memory cell C, and when the voltage applied to the both ends of the memory cell C is equal to or more than a certain voltage which is larger than the writing threshold voltage $V_{th}$ of the resistance change type memory element A, having the characteristic in which the combined resistance value of the resistance value of the resistance change type memory element A and the resistance value of the MIS transistor T in the memory cell C after performing the writing becomes almost constant irrespective of the voltage applied to the memory cell C, the combined resistance value at the both ends of the memory cell C after performing the writing becomes almost constant irrespective of the resistance value of the resistance change type memory element A before performing the writing being high resistance or low resistance; and the combined resistance value at the both ends of the memory cell C does not fall excessively.

In other words, writing can be performed without fail not depending on the resistance value of the resistance change type memory element A before performing the recording.

Further, the combined resistance value of the memory cell C after performing the writing becomes almost constant, and therefore when the information which has been recorded on the memory cell C is read, the contents of the recorded information can be detected easily from the output signal based on the combined resistance value of the memory cell C. Accordingly, read-out error can be prevented from occurring.

Thus, since the writing can be performed without fail and the read-out error can be prevented from occurring, a verification process in which the erasure is performed prior to the recording (writing or erasing) of information or the read-out is performed prior to the recording (writing or erasing) of information to feed back the result of this read-out to the voltage control circuit is not required.

According to the memory device 100 of this embodiment, since the verification process is unnecessary and there is no need to apply the voltage pulse repeatedly, which is required when RRAM is used, the writing can be performed at a high speed. Further, since the read-out error can be prevented from occurring, the read-out does not have to be done again.

Accordingly, the recording of information or the reading of information can be performed at a high speed.

In other words, according to the memory device 100 of the present embodiment, writing can be performed stably without fail.

Therefore, a memory device having high reliability can be obtained.

Further, since the on-resistance of the MIS transistor T changes depending on the gate voltage $V_{GS}$, the on-resistance of the MIS transistor T can be controlled by performing control over the gate voltage $V_{GS}$ appropriately in the memory device 100 of this embodiment. Accordingly, with appropriately selecting both the voltage V applied to the memory cell C and the gate voltage $V_{GS}$ of the MIS transistor T, the resistance value of the memory cell C which becomes almost constant after performing the writing can be controlled.

In the above mentioned embodiment, the explanation is made with respect to the case where the resistance change type memory element having the I-V characteristic shown in FIG. 1 is used as the resistance change type memory element A to form the memory cell C of the memory device 100; however, according to the present invention it is also possible to form a memory cell of the memory device by using a resistance change type memory element of another structure.

For example, as shown in FIG. 1, not only the memory element which changes into the Ohmic characteristic at a voltage comparatively close to the threshold voltage, but also a resistance change type memory element having a characteristic in which the resistance falls in a wide range of voltage from the threshold voltage can be used to form a memory cell.

In such resistance change type memory element, when the memory cell is composed of the memory element alone, the resistance value of the memory cell greatly changes depending on the applied voltage and the stability of recording is hard to be acquired.

On the other hand, with the application of the present invention and connecting the circuit element in series to the resistance change type memory element, the fall of the resistance value at the operating point can be restrained and also the change of the resistance value of the memory cell by the magnitude of applied voltage can be made small. Further, the resistance value of the memory cell after recording information can also be made into almost a constant resistance value by appropriately setting the resistance value of the circuit element.

Further, a memory cell can be formed using a resistance change type memory element having such an I-V characteristic as that of a diode in which a threshold voltage exists only at one polarity between positive and negative polarities, for example.

Figure 4:
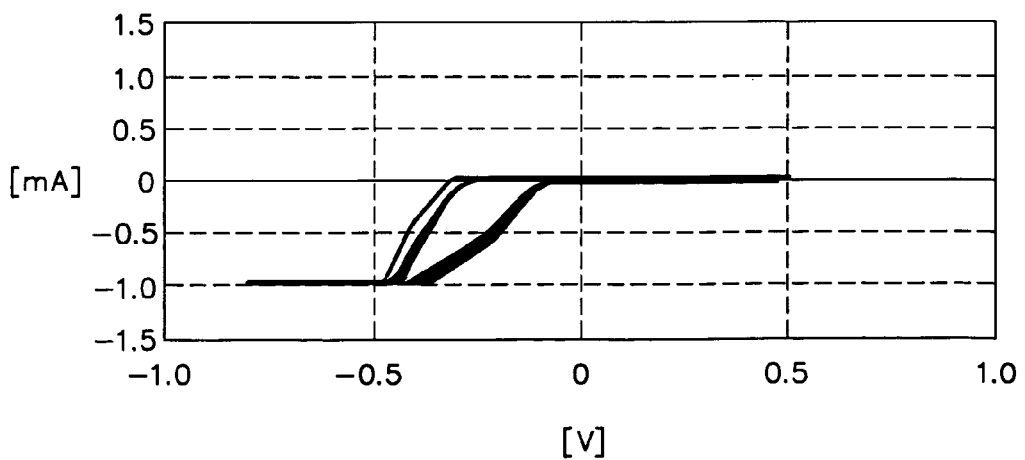
FIG. 4 is a diagram showing a measurement result of an I-V characteristic of the resistance change type memory element having a threshold voltage only with respect to one of polarities.

The measurement result of the I-V characteristic of such resistance change type memory element is shown in FIG. 4. In addition, since the measurement is made in FIG. 4 with limiting a current to −1.0 mA so that current beyond that can not flow, the current of −1.0 mA is applied even in a voltage range in which the current higher than that flows naturally.

The resistance change type memory element whose I-V characteristic is shown in FIG. 4 has a characteristic in which when a positive voltage is applied, there is no specific threshold value and therefore the resistance value returns from low resistance to high resistance.

Further, when the memory cell of the memory device of the present invention is formed using this resistance change type memory element, the operating point of the circuit element exists on the negative voltage side of FIG. 4, and similarly to the case of using the memory element having the threshold voltage on both positive and negative sides, the recording operation in this case can also be performed stably by restraining the fall of the resistance value.

PRACTICE EXAMPLE

In the followings, a memory cell of a memory device has been actually produced and the characteristic thereof has been studied.

<Experiment 1>

Figure 5:
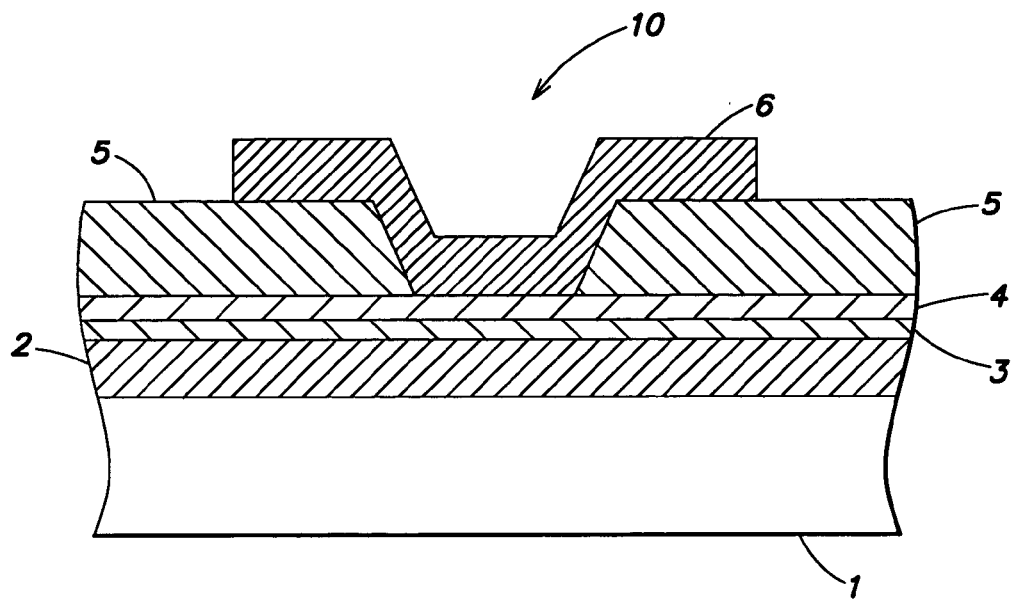
FIG. 5 is a cross-sectional view of the memory element used in an experiment.

A memory element 10 whose cross section is shown in FIG. 5 has been produced as mentioned hereunder.

First, as a lower electrode 2, a TiW film of 50 nm in thickness is deposited by a sputtering method on a substrate 1 having high electrical conductivity, for example, of a silicon substrate into which a high-concentration p-type impurity is doped.

Subsequently a Cu film of 10 nm in thickness and then a GeSbTeGd film are formed as a recording auxiliary layer 3 by using magnetron sputtering equipment, and further an amorphous Gd oxide film of 5 nm in thickness is formed as a rare-earth oxide film 4 by a reactive sputtering method based on oxygen gas introduction. This rare-earth oxide film 4 serves as a memory layer.

Secondly, a photo resist is formed to cover the amorphous Gd oxide film, and thereafter exposure and development are performed by photolithography to form an aperture (through-hole) in the photo resist on the amorphous Gd oxide film. The size of the aperture (through-hole) is set to 2 μm long and 2 μm wide.

Thereafter, annealing is performed to alter properties of the photo resist in the vacuum at 280 degrees Celsius and an insulation film 5 is formed as a hard cure resist which is stable to temperature, etching and the like. Note that, the hard cure resist is used for the insulation film 5, because that can be formed conveniently for an experiment; and when manufacturing a product, it is preferable to use another material (silicon oxide film or the like) for the insulation film 5.

Subsequently, a TiW film of 100 nm in thickness is formed as an upper electrode 6.

Thereafter, patterning is performed by the photolithography using plasma etching equipment to obtain the upper electrode 6 of 50 μm by 50 μm in size deposited on the insulation film 5 made of the hard cure resist.

Thus, the memory element 10 having the structure shown in FIG. 5 has been produced as the memory element 10 of a sample 1.

Next, an I-V characteristic of the sample 1 of the memory element 10 alone has been measured.

Hereinafter, a measurement result of the I-V characteristic is explained with data "1" referred to as a low resistance state and with data "0" referred to as a high resistance state for convenience.

The result of measurement has shown generally similar tendency to the I-V characteristic of the memory element shown in FIG. 1, and has shown a resistance value equal to or larger than approximately 10 kΩ to 100 kΩ in the high resistance state.

Further, when a voltage (here, a negative voltage) is applied in order to record the data "1" and when the applied voltage is raised from 0 volt to a voltage value V1 set to V1=−0.8 volt, −1.0 volt and −1.2 volt respectively, the resistance value after recording is almost constant and the value has been about 200Ω though slight dispersion has been generated according to the maximum applied voltage V1.

After that, when applying a voltage (here, a positive voltage) having a reverse polarity to the one at the time of recording the data "1", a sufficiently high resistance state compared to the resistance state of the data "1" has been obtained to perform the recording of the data "0".

Figure 6:
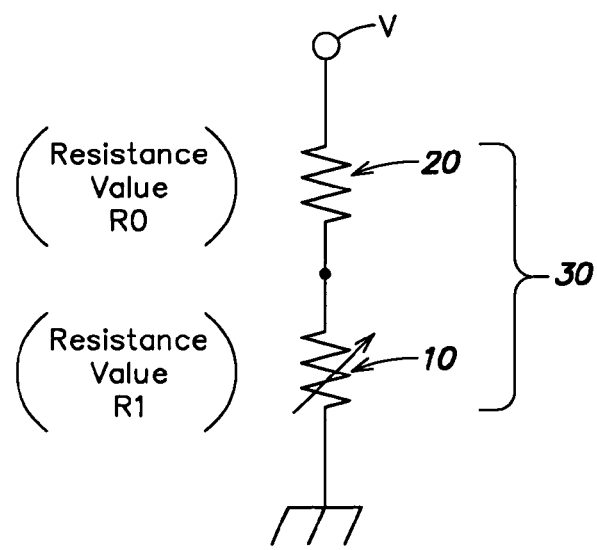
FIG. 6 is a circuit diagram of the memory cell produced by using the memory element of FIG. 5.

Next, as shown in the circuit diagram of FIG. 6, a memory cell 30 in which a resistance element 20 (resistance value R0) is connected in series to the memory element 10 (resistance value R1) whose cross section is shown in FIG.

5 has been produced. Specifically, the lower electrode 2 on the side of the substrate 1 of the memory element 10 is connected to the ground potential and the resistance element 20 is connected to the upper electrode 6.

Thus, memory cells 30 in which the resistance value R0 of the resistance element 20 is set to 1 kΩ, 2 kΩ and 5 kΩ respectively have been produced and made to be memory cells of samples 2 through 4.

Then, by changing a voltage V applied to a terminal of the resistance element 20 on the opposite side to the memory element 10, current at each voltage V has been measured to study an I-V characteristic for each sample of memory cells 30.

Figure 7A:
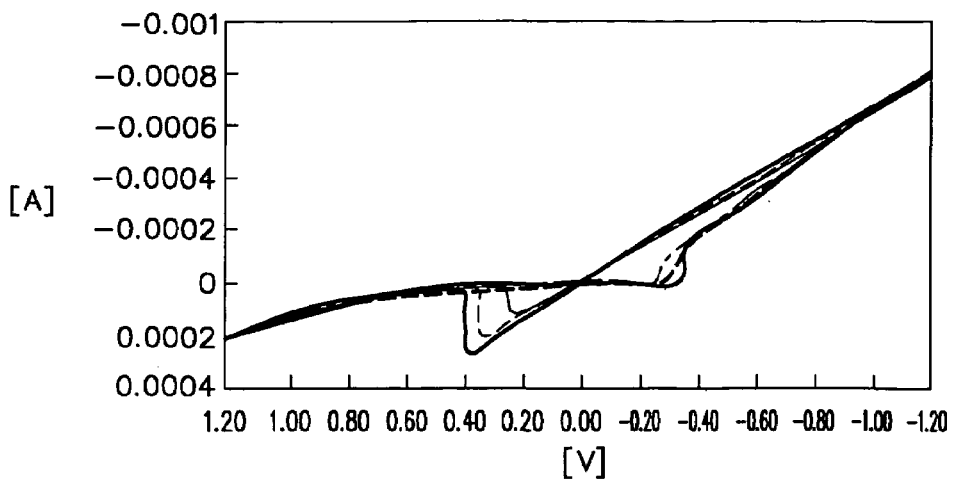
Figure 7B:
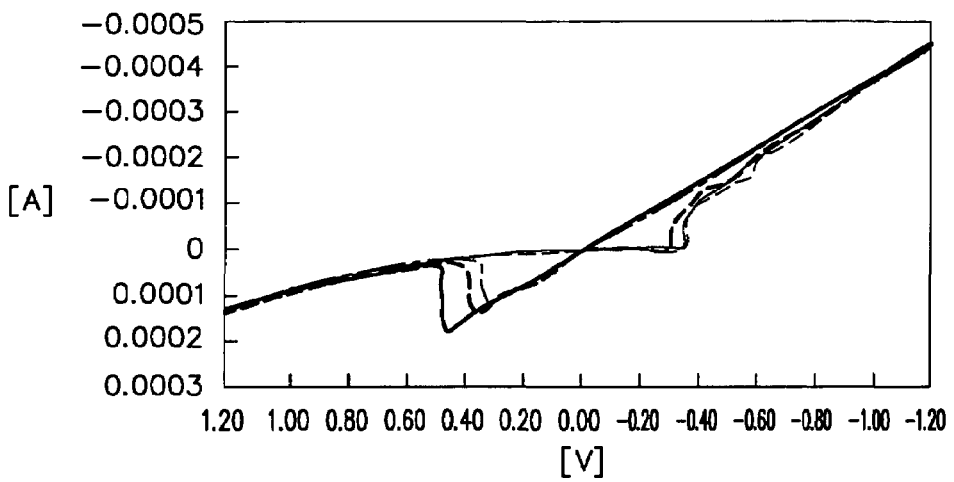
Figure 7B:
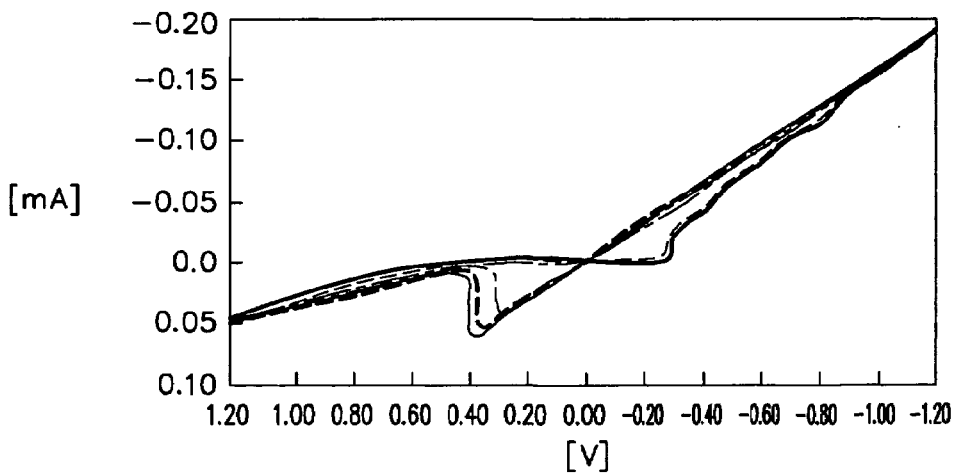

The measurement result of the memory cell (sample 2) in which the resistance value R0 of the resistance element 20 is set to 1 kΩ is shown in FIG. 7A; the measurement result of the memory cell (sample 3) in which the resistance value R0 of the resistance element 20 is set to 2 kΩ is shown in FIG. 7B; and the measurement result of the memory cell (sample 4) in which the resistance value R0 of the resistance element 20 is set to 5 kΩ is shown in FIG. 7C.

It can be understood from FIGS. 7A through 7C that a resistance value Rcell (combined resistance value of the memory element 10 and the resistance element 20) of the memory cell after recording the data "1" becomes an almost constant value irrespective of the change of voltage (amplitude) when an absolute value of the voltage V is larger than 0.8 volt. At this time, the resistance value R1 of the memory element 10 is also almost a constant value.

The resistance value Rcell of the memory cell after recording is Rcell=1.5 kΩ at R0=1 kΩ (sample 2), Rcell=2.7 kΩ at R0=2 kΩ (sample 3) and Rcell=6.3 kΩ at R0=5 kΩ (sample 4).

Further, because Rcell=R0+R1, the resistance value R1 of the memory element 10 is R1=0.5 kΩ at R0=1 kΩ (sample 2), R1=0.7 kΩ at R0=2 kΩ (sample 3) and R1=1.3 kΩ at R0=5 kΩ (sample 4).

Figure 8:
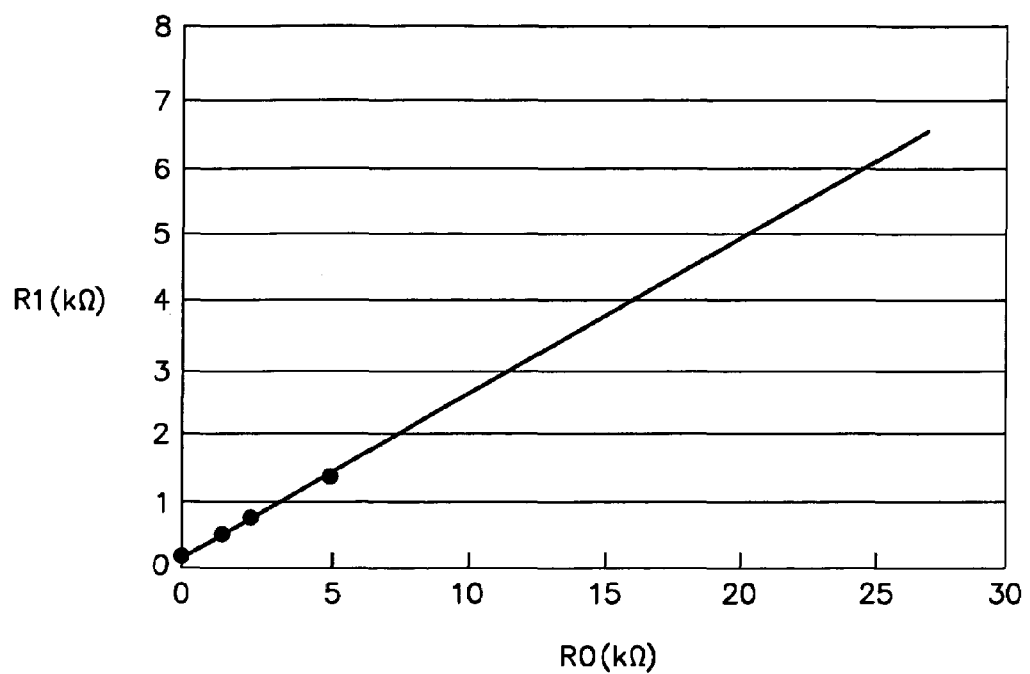
FIG. 8 is a diagram showing a relation between the resistance value of the resistance element and the resistance value of the memory element, when each of the resistance values of the memory cells in FIGS. 7A through 7C becomes almost constant.

Those results are collectively shown in FIG. 8. In FIG. 8, a horizontal axis shows a resistance value R0 of the resistance element 20, and a vertical axis shows a resistance value R1 of the memory element 10 when the resistance value of the memory cell becomes almost constant.

It can be understood from FIG. 8 that the resistance value R1 of the memory element 10 after recording is determined correspondingly to the resistance value R0 of the resistance element 20 and changes almost linearly.

<Experiment 2>

Next, a resistance change in the memory element has been measured when overwriting is performed in the memory cell structure of the memory device according to the present invention.

Figure 9A:
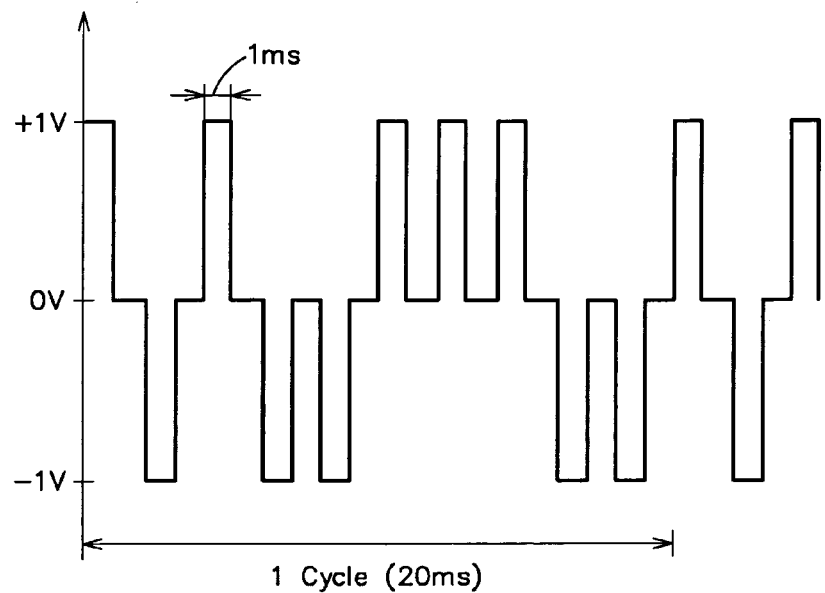
FIG. 9A is a diagram showing a pulse voltage applied to between both ends of the memory cell of FIG. 6.

The memory cell 30 whose circuit diagram is shown in FIG. 6 is produced; a pulse voltage of ±1 volt having a pulse width of 1 millisecond is applied in a random polarity to both ends of the memory cell 30 as shown in FIG. 9A; and a signal level which is read out from the memory cell C has been measured by setting a read-out voltage to 0.1 volt immediately after each pulse is applied. In addition, a polarity pattern of the pulse voltage is set to 20 milliseconds per one cycle and is repeated.

Figure 9B:
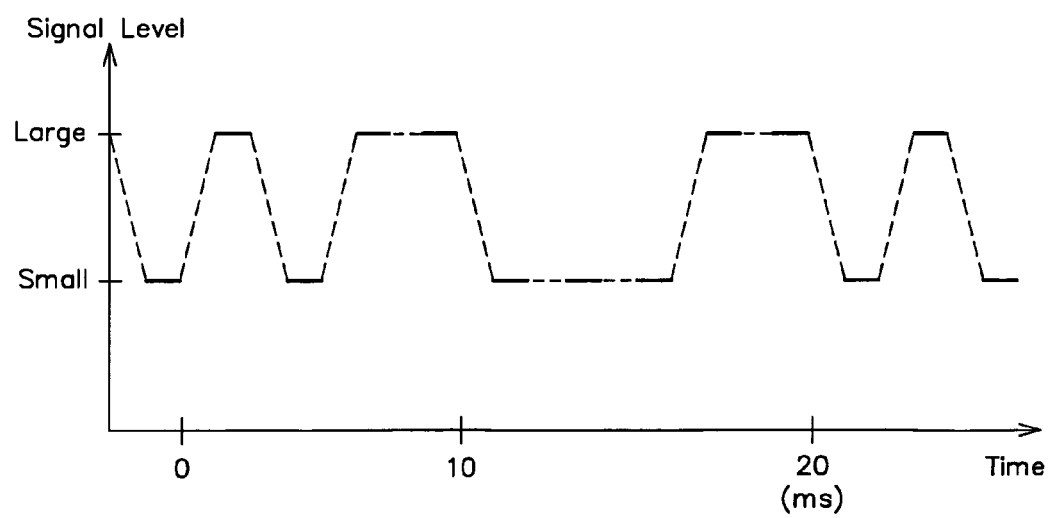
FIG. 9B is a diagram showing a measurement result of a signal level read from the memory cell when the pulse voltage of FIG. 9A is applied.

The result of this measurement is shown in FIG. 9B. As shown in FIG. 9B, the magnitude of signal level is proportional to the resistance value of the memory element A, and the higher the resistance value of the memory element A is, the larger signal level can be obtained.

It can be understood from FIG. 9B that after the pulse voltage is applied, the signal level corresponds to the polarity of the applied pulse voltage irrespective of the signal level before applying the pulse voltage.

Moreover, it can be understood that the magnitude of signal level does not change even if the voltage pulse having the same polarity is successively applied.

Therefore, it can be understood that the resistance value is almost constant not depending on the data pattern before performing the recording, even when the data "0" or "1" is recorded at random.

In FIG. 9A, the recording pulse width is made into 1 millisecond, because the longer the pulse width is, the more strictly data pattern dependence before recording can be evaluated; however, the similar result has also been obtained when the pulse width is short, for example, when it is 20 nanoseconds.

<Experiment 3>

Next, in the structure of the memory cell of the memory device according to the present invention, a change of the resistance value after recording has been studied when the pulse width of the pulse voltage applied to the memory cell is changed.

Figure 10:
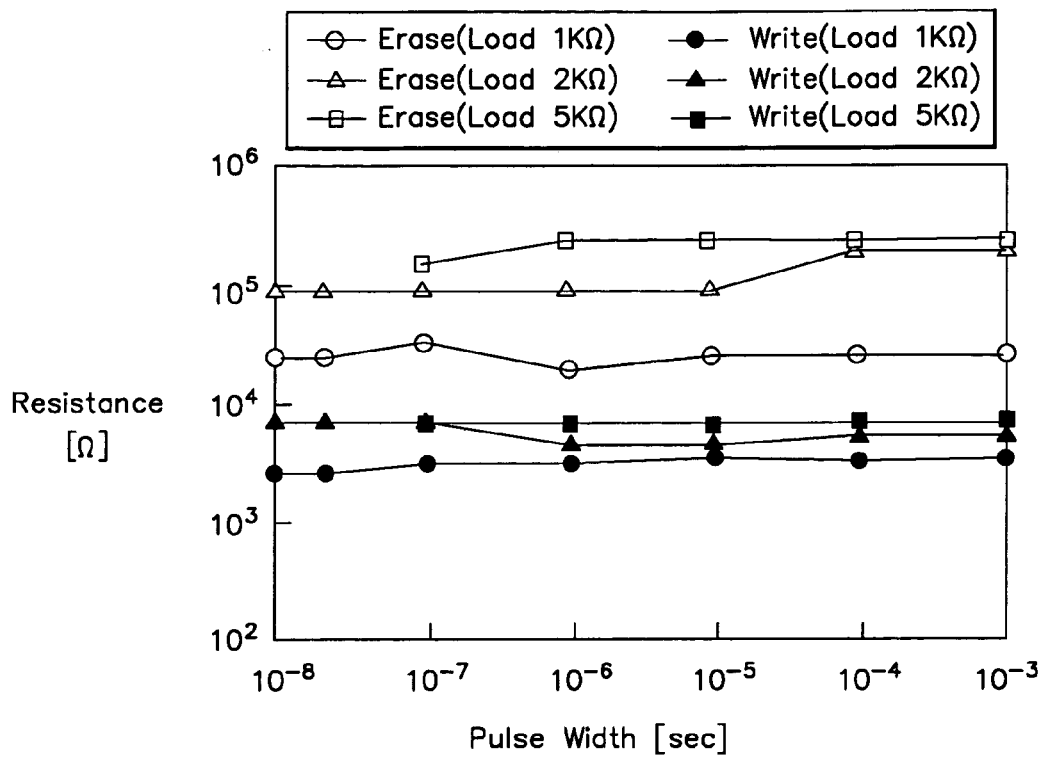
FIG. 10 is a diagram showing a relation between a pulse width of the pulse voltage and a combined resistance value of the memory cell after recording, when the pulse voltage is applied between the both ends of the memory cell when recording and erasing is performed.

When the memory cell 30 is formed such that: when as the resistance element 20 in FIG. 6 each of the resistance elements having resistance values of 1 kΩ, 2 kΩ and 5 kΩ respectively is connected in series to the memory element 10 and the pulse voltage is applied to the both ends of the memory cell 30 at the time of recording (Write) and at the time of erasing (Erase), the pulse width of the pulse voltage is changed and the combined resistance value of the memory cell 30 after recording has been measured, respectively. FIG. 10 shows as a result of the measurement a relation between the pulse width of the pulse voltage and the combined resistance value of the memory cell 30 after recording.

It can be understood from FIG. 10 that the resistance value of the memory cell 30 after recording becomes almost constant in a wide range from a pulse width of $10^{-8}$ sec (10 nanoseconds) at the utmost left of the diagram to a pulse width of $10^{-3}$ sec (1 millisecond) at the utmost right of the diagram.

Note that, since the structure of the memory element 10 in this experiment 3 is different from that in the experiment 1, the specific resistance values after recording are different from those in FIGS. 7A through 7C.

Thus, since the recording can also be performed using the voltage pulse of short pulse width, the recording of information can be performed in a short period of time and at a high speed.

As a reason why such high speed operation becomes possible, it can be considered that a portion to determine the resistance value of the memory element 10 is an extremely thin region of 10 nm or less (more preferably, 5 nm or less) formed of such as the rare-earth oxide film 4 of the memory element 10 in FIG. 5, for example, and also in the rare-earth oxide film containing a metal such as Cu, Ag, or Zn which can be easily ionized, there occurs high speed ion conduction or oxidation-reduction.

Further, the rare-earth oxide film is of an amorphous structure capable of operating uniformly even when processed into an extremely minute element, and furthermore a melting point thereof is high so as to operate stably against a temperature change.

In addition, in the memory device of the present invention, the range of desirable resistance value of the circuit element connected in series to the memory element is dependent on the I-V characteristic with respect to the voltage equal to or more than the threshold voltage of the memory element.

For example, in case of the memory element which has the I-V characteristic shown in FIG. 1, it is desirable to make the resistance value of the circuit element at least within the range between the minimum resistance value of the memory element and the maximum resistance value thereof.

Moreover, in the memory device of the present invention, the circuit element connected in series to the memory element is not limited to the MIS transistor T or the resistance element, and an active element such as another kind of transistor or a diode can be used. When an active element is used, a selection of memory cell can be performed by the active element.

According to the memory device of the present invention, the verification after performing the recording of information becomes unnecessary, and therefore such an advantage that the time required for recording can be shortened to that extent can be obtained.

Accordingly, in the memory device of the present invention, normally the verification after recording is not performed.

Note that, when the memory device is used in a case where recording in a short period of time and at a high speed is not required, the verification after recording may be performed in order to make certain that the recording of information is performed without fail in the memory device of the present invention.

Figures 11A, 11B:
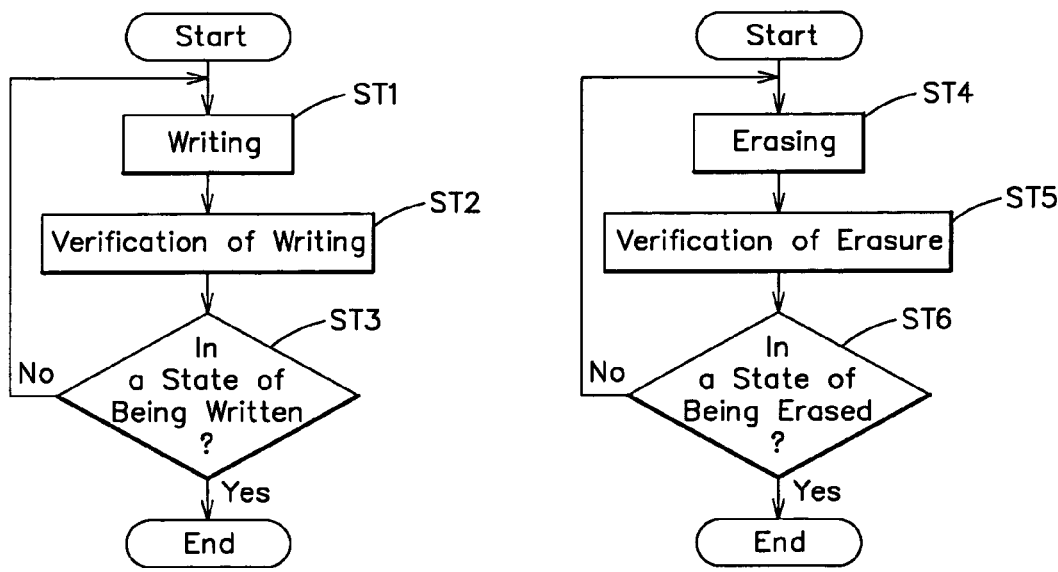
FIG. 11A is a flow chart of writing verification.
FIG. 11B is a flow chart of erasure verification.

Further, even in the memory device of the present invention, the verification can be performed as shown in flow charts of FIGS. 11A and 11B, for example.

FIG. 11A shows a flow chart for the verification of writing.

First, at a step ST1, the writing is performed on the memory element of the memory cell.

Then, at a step ST2, the verification of writing is performed in the memory cell in which the writing is performed. Specifically, a read-out operation is performed with respect to the memory cell in which the writing is performed to measure a resistance value of the memory cell.

Next, at a step ST3, if the memory cell in which the writing is performed is in a state of being written (a state where the resistance value is a predetermined low resistance value) when measuring the resistance value of the memory cell, the writing is ended. On the other hand, when it is not in the sate of being written, it is judged that the writing has failed and the writing is again performed on the memory element of the memory cell after returning to the step ST1.

It is possible to perform the writing without fail in such operation flow.

FIG. 11B shows a flow chart for the verification of erasure.

First, at a step ST4, an erasure is performed on the memory element of the memory cell.

Then, at a step ST5, the verification of erasure is performed in the memory cell to which the erasure is performed. Specifically, a read-out operation is performed with respect to the memory cell to which the erasure is performed to measure a resistance value of the memory cell.

Next, at a step ST6, if the memory cell on which the erasure is performed is in a state of being erased (a state where the resistance value is a predetermined high resistance value) when measuring the resistance value of the memory cell, the erasure is ended. On the other hand, when it is not in the state of being erased, it is judged that the erasure has failed and the erasure is again performed on the memory element of the memory cell after returning to the step ST4.

It is possible to perform the erasure without fail in such flow.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A memory device, comprising:
   a memory cell including:
      a memory element having a characteristic in which a resistance value changes when applying voltage equal to or more than a threshold voltage between both ends thereof, and
      a circuit element as a load connected in series to said memory element;
   wherein:
   when an operation to change said memory element from a state of high resistance value to a state of low resistance value is defined as writing, and
   when a voltage applied between both ends of said memory element and said circuit element is equal to or more than a certain voltage value which is larger than said threshold voltage,
   a combined resistance value of said memory element and said circuit element in said memory cell after performing said writing becomes almost constant irrespective of the magnitude of said voltage.

2. The memory device according to claim 1, wherein:
   said memory element further includes a memory layer interposed between first and second electrodes, and when a voltage equal to or more than said threshold voltage is applied between said first and second electrodes, a resistance value of said memory layer changes, so that a resistance value of said memory element changes.

3. The memory device according to claim 2, wherein:
   said memory layer of said memory element is comprised of amorphous rare-earth oxide film, and Cu, Ag, or Zn is added to said amorphous rare-earth oxide film whose film thickness is equal to or less than 10 nm.

* * * * *